United States Patent
Shigihara et al.

(10) Patent No.: US 8,731,018 B2
(45) Date of Patent: May 20, 2014

(54) SEMICONDUCTOR LASER

(75) Inventors: Kimio Shigihara, Tokyo (JP); Takuto Maruyama, Tokyo (JP); Akihito Ohno, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 298 days.

(21) Appl. No.: 13/217,430

(22) Filed: Aug. 25, 2011

(65) Prior Publication Data

US 2012/0195337 A1 Aug. 2, 2012

(30) Foreign Application Priority Data

Jan. 27, 2011 (JP) .................. 2011-015414

(51) Int. Cl.
*H01S 5/125* (2006.01)
*H01S 5/343* (2006.01)

(52) U.S. Cl.
USPC .................. 372/50.11; 372/45.01

(58) Field of Classification Search
USPC ......................... 372/45.01, 50.11
See application file for complete search history.

(56) References Cited

U.S. PATENT DOCUMENTS

| | | | | |
|---|---|---|---|---|
| 5,693,965 A | * | 12/1997 | Yamada | 257/94 |
| 6,477,191 B1 | * | 11/2002 | Okada et al. | 372/50.11 |
| 2003/0007527 A1 | | 1/2003 | Tsukiji et al. | |
| 2009/0080484 A1 | * | 3/2009 | Shigihara | 372/46.01 |

FOREIGN PATENT DOCUMENTS

| | | |
|---|---|---|
| JP | 62-269375 A | 11/1987 |
| JP | 3-16288 A | 1/1991 |
| JP | 9-129971 A | 5/1997 |
| JP | 2003-86891 A | 3/2003 |
| JP | 2004-165383 A | 6/2004 |

* cited by examiner

*Primary Examiner* — Jessica Stultz
*Assistant Examiner* — Michael Carter
(74) *Attorney, Agent, or Firm* — Leydig, Voit & Mayer, Ltd.

(57) ABSTRACT

A semiconductor laser includes: a DBR (Distributed Bragg Reflector) region having a diffraction grating; a FP (Fabry-Perot) region having no diffraction grating; and an optical waveguide section placed between the DBR region and an outputting end surface. A length of the optical waveguide section is longer than a length of the DBR region in a resonator length direction.

3 Claims, 4 Drawing Sheets

OUTPUTTING END SURFACE ← RESONATOR LENGTH DIRECTION → REAR SURFACE

SEMICONDUCTOR LASER

BACKGROUND OF THE INVENTION

1. Field of the Invention

The present invention relates to a semiconductor laser used in an excitation light source, a motion sensor, a light source for optical communications and the like.

2. Background Art

In conventional semiconductor lasers, a DBR (Distributed Bragg Reflector) region where a diffraction grating was formed was formed in a p-type AlGaAs clad layer in the vicinity of an output end face (for example, refer to Japanese Patent Application Laid-Open No. 2004-165383).

SUMMARY OF THE INVENTION

In a DBR region and other FP (Fabry-Perot) regions, refractive index distributions in the laminating direction are different. For this reason, light propagating the FP region and traveling toward the output end face is subjected to perturbation due to difference in the refractive indices in the DBR region, and the wave guide mode being light-intensity distribution is subjected to perturbation. Therefore, there was a problem wherein the far-field pattern (FFP), which is the output beam shape, was disturbed, and affected the subsequent optical systems. In addition, since the diffraction grating was formed in an AlGaAs clad layer, there was another problem wherein the temperature characteristics of the laser were poor.

In order to solve problems as described above, the first object of the present invention is to obtain a semiconductor laser that can stabilize the outputting beam form. The second object is to obtain a semiconductor laser having favorable temperature characteristics.

According to the first invention, a semiconductor laser includes: a DBR (Distributed Bragg Reflector) region having a diffraction grating; a FP (Fabry-Perot) region having no diffraction grating; and an optical waveguide section placed between the DBR region and an outputting end surface, wherein a length of the optical waveguide section is longer than a length of the DBR region in a resonator length direction.

According to the second invention, a semiconductor laser includes: an active layer; AlGaInP clad layers sandwiching the active layer; a buried layer provided in the AlGaInP clad layer; and a diffraction grating layer buried in the buried layer and having a diffraction grating, wherein the buried layer is AlGaAs, or AlGaInP having an Al composition ratio different from the AlGaInP clad layers, the diffraction grating layer is AlGaAs having an Al composition ratio different from the buried layer, InGaP, or AlGaInP having an Al composition ratio different from the AlGaInP clad layers and the buried layer.

The first invention makes it possible to obtain a semiconductor laser that can stabilize the outputting beam form. The second invention makes it possible to obtain a semiconductor laser having favorable temperature characteristics.

Other and further objects, features and advantages of the invention will appear more fully from the following description.

DETAILED DESCRIPTION OF THE PREFERRED EMBODIMENTS

A semiconductor laser according to the embodiments of the present invention will be described with reference to the drawings. The same components will be denoted by the same symbols, and the repeated description thereof may be omitted.

First Embodiment

Figure 1:
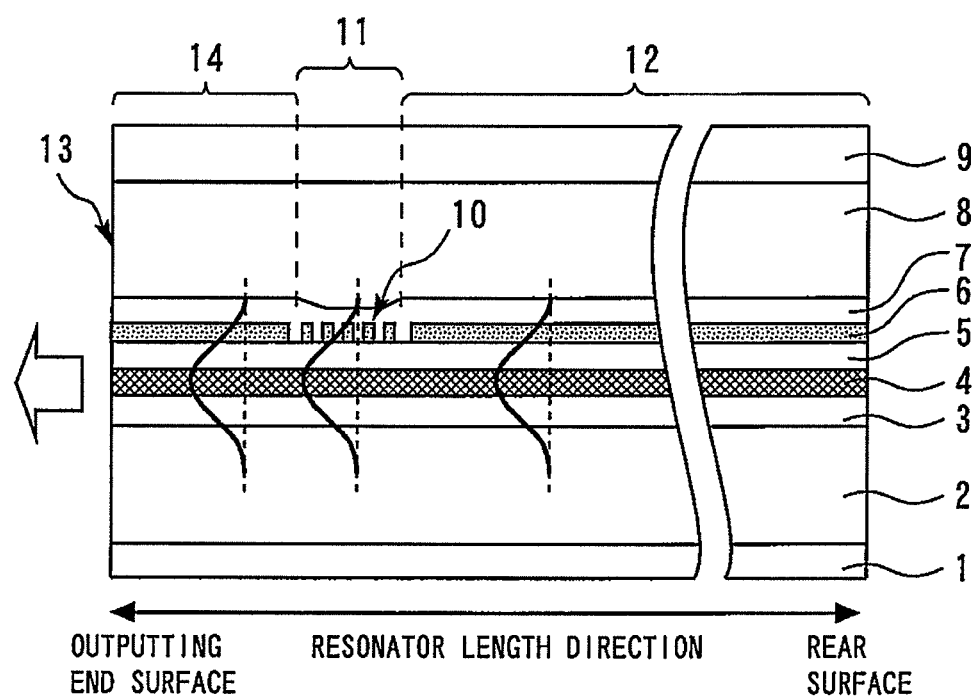
FIG. 1 is a sectional diagram taken along the resonator length direction of a semiconductor laser according to the first embodiment of the present invention.

FIG. 1 is a sectional diagram taken along the resonator length direction of a semiconductor laser according to the first embodiment of the present invention. On an n-type GaAs substrate 1, an n-type AlGaInP clad layer 2, a light guiding layer 3, an active layer 4, a light guiding layer 5, a diffraction grating layer 6, a buried layer 7, a p-type AlGaInP clad layer 8, and a p-type contact layer 9 are sequentially laminated.

The n-type AlGaInP clad layer 2 is an $(Al_{0.3}Ga_{0.70})_{0.51}In_{0.49}P$ layer having a thickness of 2 µm, the light guiding layer 3 is an undoped $Al_{0.4}Ga_{0.6}As$ layer having a thickness of 15 nm, the active layer 4 is an undoped GaAs layer having a thickness of 6 nm, the light guiding layer 5 is an undoped $Al_{0.4}Ga_{0.6}As$ layer having a thickness of 15 nm, the diffraction grating layer 6 is a p-type $Al_{0.6}Ga_{0.4}As$ layer having a thickness of 25 nm, the buried layer 7 is a p-type $Al_{0.4}Ga_{0.6}As$ layer having a thickness of 50 nm, the p-type AlGaInP clad layer 8 is a p-type $(Al_{0.30}Ga_{0.70})_{0.51}In_{0.49}P$ layer having a thickness of 2 µm, and the p-type contact layer 9 is a p-type GaAs layer having a thickness of 0.3 µm.

A diffraction grating 10 is formed by periodically etching off a part the diffraction grating layer 6, and growing the buried layer 7 thereon. The semiconductor laser has a DBR (Distributed Bragg Reflector) region 11 whereon the diffraction grating 10 is formed, and an FP (Fabry-Perot) region 12 whereon the diffraction grating 10 is not formed. An optical waveguide section 14 is placed between the DBR region 11 and the outputting end surface 13. In the resonator length direction, the length Lg of the optical waveguide section 14 is longer than the length Ldbr of the DBR region 11 (L≥Ldbr).

Since the perturbation received in the DBR region 11 is relieved in the optical waveguide section 14, the shape of outputting beams can be stabilized. For enhancing this effect, it is required to make the reflectance of the outputting end surface 13 lower than the reflectance determined by the diffraction grating 10, and if possible, it is desired that the outputting end surface 13 is nonreflecting.

When the thickness of the diffraction grating layer 6 is te, the refractive index thereof is ne, and the thickness of the buried layer 7 is tb, the refractive index thereof is nb, the average of the diffraction grating layer 6 and the buried layer 7 is (ne·te+nb·tb)/(te+tb). This average refractive index is made higher than the refractive index of the p-type AlGaInP clad layer 8 and the undoped light guiding layer 3 respectively adjoined to the diffraction grating layer 6 and the buried layer 7. Thereby, since the light intensity at the portion where the diffraction grating layer 6 is added to the buried layer 7 is increased, the coupling efficiency of the light intensity distribution (waveguide mode) at the diffraction grating 10 can be elevated. Therefore, since the DBR region 11 can be shortened, the perturbation can be minimized.

Second Embodiment

Figure 2:
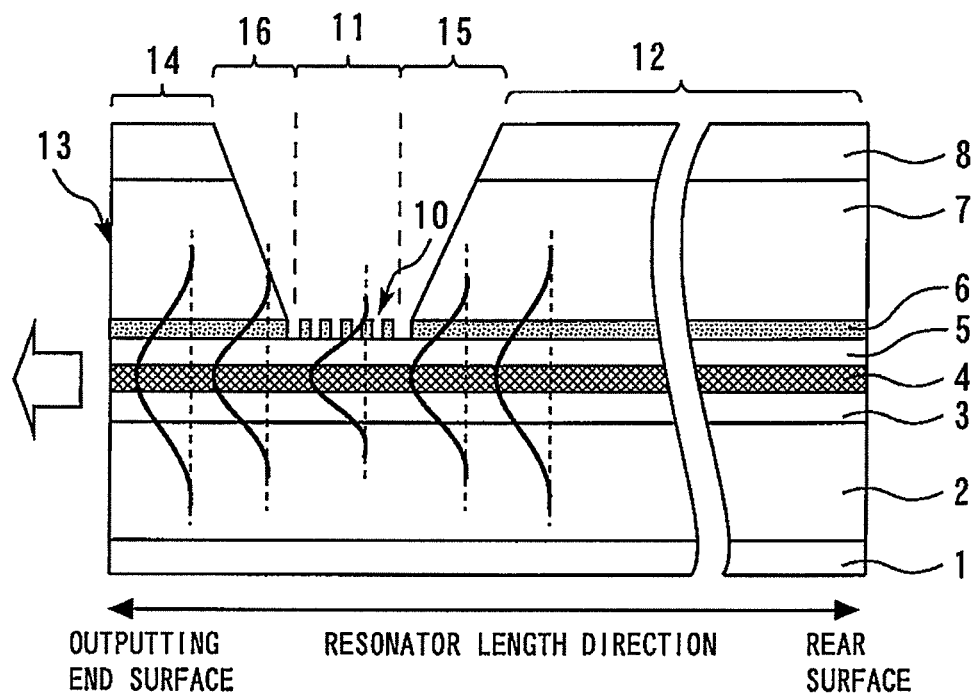
FIG. 2 is a sectional view taken along the resonator length direction of a semiconductor laser according to the second embodiment of the present invention.

FIG. 2 is a sectional view taken along the resonator length direction of a semiconductor laser according to the second embodiment of the present invention. A first tapered waveguide 15 is formed between the DBR region 11 and the FP region 12, and a second tapered waveguide 16 is formed between the DBR region 11 and the optical waveguide section 14. In the first and second tapered waveguides 15 and 16, the semiconductor layer becomes gradually thin toward the DBR region 11.

Light propagated from the FP region 12 is smoothly led to the DBR region 11 by the first tapered waveguide 15. Then, light propagated in the DBR region 11 is smoothly led to the optical waveguide section 14 by the second tapered waveguide 16. Therefore, by forming the first and second tapered waveguides 15 and 16, the outputting beam shape can be further stabilized. Although only first and second tapered waveguides 15 and 16 cannot transform the light to a stable mode, the optical waveguide section 14 finally transforms the light to a stable mode.

After forming all the semiconductor layers using one epitaxial crystal growth, the diffraction grating 10 is formed by etching. Since epitaxial crystal growth is performed only once, the degradation of characteristics caused by non-luminescence recombination center due to regrown interface can be avoided.

Third Embodiment

Figure 3:
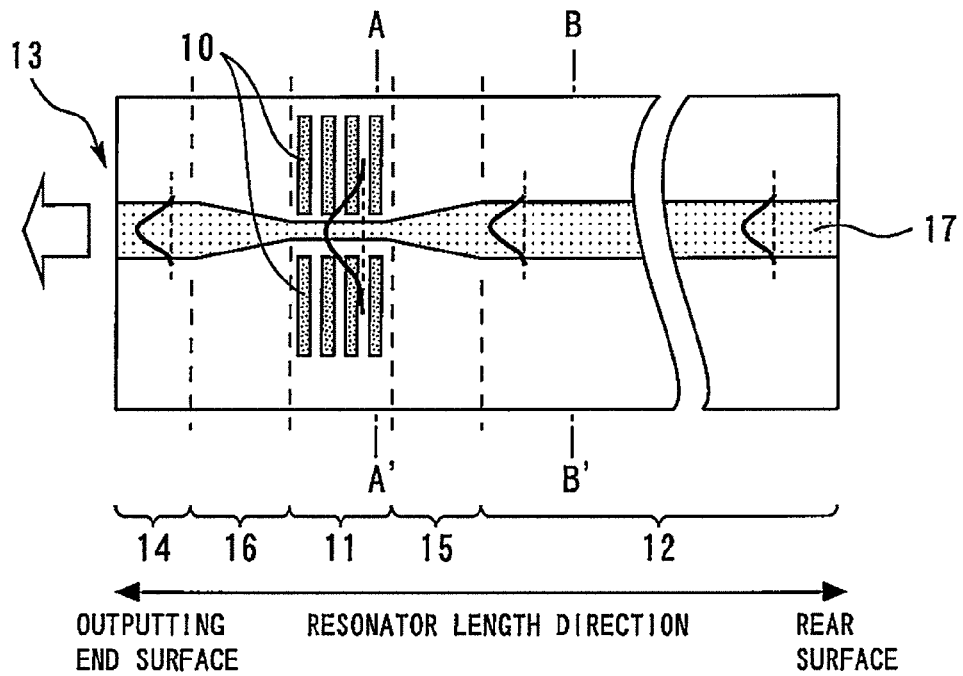
FIG. 3 is a top view taken along the resonator length direction of a semiconductor laser according to the third embodiment of the present invention.
Figure 4:
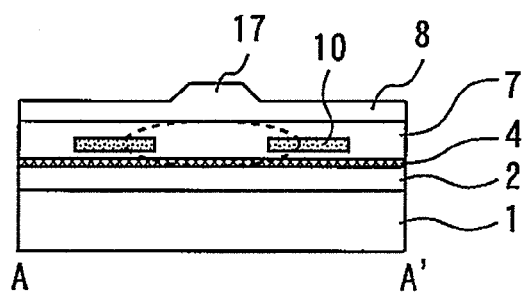
FIG. 4 is a sectional view taken along the line A-A' in FIG. 3.
Figure 5:
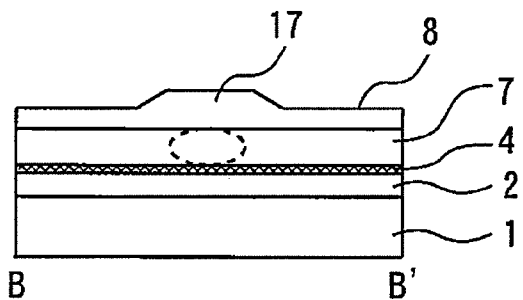
FIG. 5 is a sectional view taken along the line B-B' in FIG. 3.

FIG. 3 is a top view taken along the resonator length direction of a semiconductor laser according to the third embodiment of the present invention. FIG. 4 is a sectional view taken along the line A-A' in FIG. 3. FIG. 5 is a sectional view taken along the line B-B' in FIG. 3. A first tapered waveguide 15 is formed between the DBR region 11 and the FP region 12, and a second tapered waveguide 16 is formed between the DBR region 11 and the optical waveguide section 14. A ridge 17 is formed on the DBR region 11, the FP region 12, the optical waveguide section 14, and first and second tapered waveguides 15 and 16. In the first and second tapered waveguides 15 and 16, the width of the ridge 17 is gradually narrowed toward the DBR region 11. On the DBR region 11, the FP region 12, and the optical waveguide section 14, the ridge 17 has a straight shape.

Light propagated from the FP region 12 is smoothly guided to the DBR region 11 by the first tapered waveguide 15. Then, the light propagated through the DBR region 11 is smoothly guided to the optical waveguide section 14 by the second tapered waveguide 16. Therefore, by forming first and second tapered waveguides 15 and 16, the outputting beam shape can be further stabilized. Although the stable mode cannot be obtained only by the first and second tapered waveguides 15 and 16, the stable mode can be finally obtained by the optical waveguide section 14.

The diffraction grating 10 is not placed in the ridge 17 wherein a current flows, but is placed on the both sides of the ridge 17. Therefore, the degradation of characteristics caused by non-luminescence recombination center can be avoided in the diffraction grating 10. Although the diffraction grating 10 is buried in the present embodiment, the equivalent effect can also be obtained even if the diffraction grating 10 is not buried.

The lasers in the first to third embodiments are semiconductor lasers of the oscillation wavelength of nearly 830 nm composed of an AlGaInP clad layer, an AlGaAs guide layer, and a GaAs active layer. However, the present invention is not limited thereto, but can be applied to a semiconductor laser for communications wherein the active layer and the guide layer are composed of InGaAsP and the clad layer is composed of InP, a semiconductor laser of 800 nm band wherein the clad layer and the guide layer are composed of AlGaAs, an InGaN-based blue-violet semiconductor laser, an AlGaInP-based red semiconductor laser, and DBR semiconductor lasers using other material systems.

Fourth Embodiment

Figure 6:
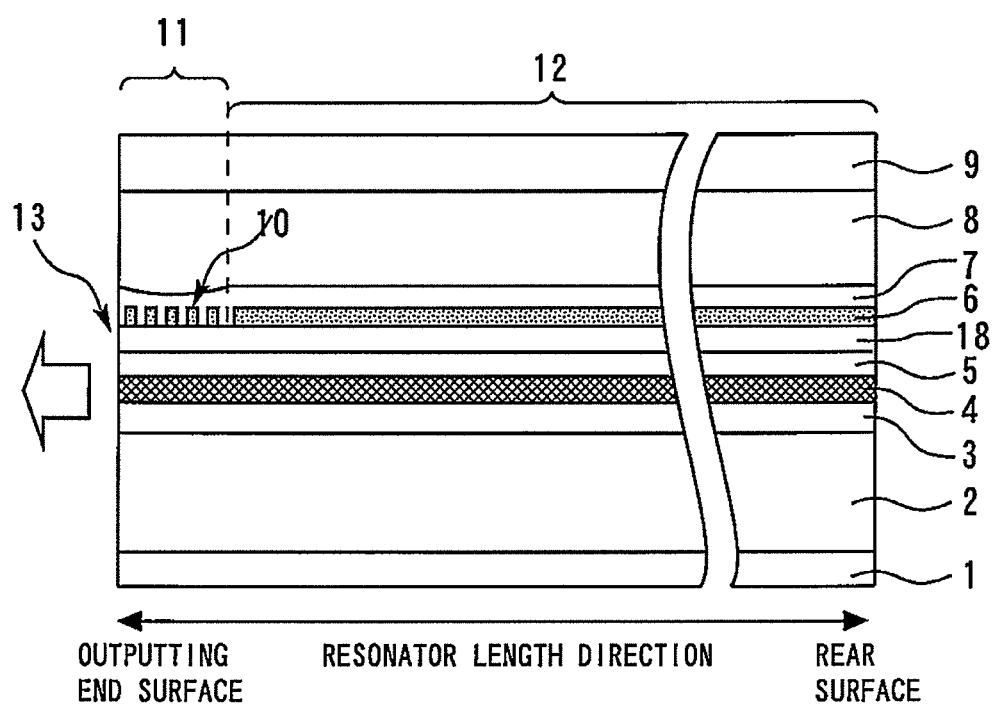
FIG. 6 is a sectional view taken along the resonator length direction of a semiconductor laser according to the fourth embodiment of the present invention.

FIG. 6 is a sectional view taken along the resonator length direction of a semiconductor laser according to the fourth embodiment of the present invention. On the n-type GaAs substrate 1, an n-type AlGaInP clad layer 2, a light guiding layer 3, an active layer 4, a light guiding layer 5, a p-type AlGaInP clad layer 18, a diffraction grating layer 6, a buried layer 7, a p-type AlGaInP clad layer 8, and a p-type contact layer 9 are sequentially laminated.

The n-type AlGaInP clad layer 2 is an $(Al_{0.20}Ga_{0.80})_{0.51}In_{0.49}P$ layer of a thickness of 3 μm, the light guiding layer 3 is an undoped $Al_{0.4}Ga_{0.6}As$ layer of a thickness of 22 nm, the active layer 4 is an undoped GaAs layer of a thickness of 6 nm, the light guiding layer 5 is an undoped $Al_{0.4}Ga_{0.6}As$ layer of a thickness of 22 nm, the p-type AlGaInP clad layer 18 is a p-type $(Al_{0.15}Ga_{0.85})_{0.51}In_{0.49}P$ layer of a thickness of 150 nm, the diffraction grating layer 6 is a p-type $Al_{0.5}Ga_{0.5}As$ layer of a thickness of 45 nm, the buried layer 7 is a p-type $Al_{0.35}Ga_{0.65}As$ layer of a thickness of 90 nm, the p-type AlGaInP clad layer 8 is a p-type $(Al_{0.15}Ga_{0.85})_{0.51}In_{0.49}P$ layer of a thickness of 1.9 μm, and the p-type contact layer 9 is a p-type GaAs layer of a thickness of 0.3 μm.

The buried layer 7 is formed in the p-type AlGaInP clad layers 8 and 18, and the diffraction grating layer 6 wherein the diffraction grating 10 is formed, are buried in the buried layer 7. Since the P-type AlGaInP clad layer 18 has higher bandgap energy than the conventional AlGaAs clad layer, the electron barrier to the light guiding layer 5 can be made high. Therefore, since electrons implanted into the active layer 4 become hard to overflow into the p-type AlGaInP clad layer 18, a semiconductor laser having favorable temperature characteristics can be obtained.

As a modification example of the present embodiment, when a p-type $Ga_{0.51}In_{0.49}P$ layer having a thickness of 40 nm is used as the diffraction grating layer 6, and a p-type $(Al_{0.2}Ga_{0.80})_{0.51}In_{0.49}P$ layer having a thickness of 80 nm as the buried layer 7, the equivalent effect can be obtained.

Also when AlGaAs, or AlGaInP having an Al composition ratio different from p-type AlGaInP clad layers 8 and 18 is used as the buried layer 7, and AlGaAs, InGaP, or AlGaInP having an Al composition ratio different from p-type AlGaInP clad layers 8 and 18 and the buried layer 7 as the diffraction grating layer 6, the deflective difference between the buried layer 7 and the diffraction grating layer 6 can be optionally set.

Although the present embodiment is described using a DBR laser as the example, the equivalent effect can be obtained from a DFB laser wherein a diffraction grating is present in the entire direction of the resonator length. In addition, the optical waveguide section 14 can be formed as in the first to third embodiments, thereby; the outputting beam shape can be stabilized. Furthermore, although the oscillation wavelength of the semiconductor laser in the present embodiment is in the vicinity of 830 nm, the present invention is not limited thereto, but can also be applied to other semiconductor lasers using AlGaInP clad layers.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2011-015414, filed on Jan. 27, 2011 including specification, claims, drawings and summary, on which the Convention priority of the present application is based, are incorporated herein by reference in its entirety.

What is claimed is:

1. A semiconductor laser comprising:
an active layer;
cladding layers sandwiching the active layer;
a Distributed Bragg Reflector (DBR) region including part of the active layer and parts of the cladding layers and having a diffraction grating, wherein
the diffraction grating includes a diffraction grating layer, and a burying layer on and burying the diffraction grating layer and in contact with one of the cladding layers, and
the diffraction grating layer has a periodic thickness;
a Fabry-Perot (FP) region having no diffraction grating and including parts of the active layer, the burying layer, the diffraction grating layer, and the cladding layers; and
an optical waveguide region, including parts of the active layer, the diffraction grating layer, the burying layer, and the cladding layers, located between the DBR region and a light output end surface of the semiconductor laser, wherein
the optical waveguide region is longer than the DBR region in a resonator length direction of the semiconductor laser, and
the parts of the active layer, the diffraction grating layer, the burying layer, and the cladding layers in the optical waveguide region have uniform thicknesses in the optical waveguide region.

2. The semiconductor laser according to claim 1, wherein average refractive index of the diffraction grating layer and the burying layer is higher than refractive index of the cladding layer adjacent the diffraction grating layer and the burying layer.

3. The semiconductor laser according to claim 1, wherein the cladding layers are AlGaInP;
the burying layer is AlGaAs or AlGaInP having an Al composition ratio different from the AlGaInP cladding layers, and
the diffraction grating layer is selected from the group consisting of AlGaAs having an Al composition ratio different from the Al composition ratio of the burying layer, InGaP, and AlGaInP having an Al composition ratio different from Al composition ratios of the AlGaInP cladding layers and the burying layer.

* * * * *